(12) United States Patent
Bash et al.

(10) Patent No.: US 7,203,063 B2
(45) Date of Patent: Apr. 10, 2007

(54) SMALL FORM FACTOR LIQUID LOOP COOLING SYSTEM

(75) Inventors: Cullen E. Bash, San Francisco, CA (US); Glenn C. Simon, Auburn, CA (US); Christopher G. Malone, Loomis, CA (US); Ratnesh K. Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/849,759

(22) Filed: May 21, 2004

(65) Prior Publication Data
US 2005/0259397 A1 Nov. 24, 2005

(51) Int. Cl.
*H05K 7/20* (2006.01)
(52) U.S. Cl. ............... 361/699; 361/695; 361/696; 361/697; 174/15.1; 165/80.4; 165/104.33
(58) Field of Classification Search ............. 361/677, 361/678, 687–691, 694–699, 711, 719–721; 174/15.1, 16.1, 16.3; 165/80.4, 104.33, 80.3; 62/259.2; 454/184
See application file for complete search history.

(56) References Cited

U.S. PATENT DOCUMENTS

| | | | | |
|---|---|---|---|---|
| 5,509,468 A | * | 4/1996 | Lopez | 165/144 |
| 6,023,402 A | * | 2/2000 | Kaminski | 361/103 |
| 6,115,250 A | * | 9/2000 | Schmitt | 361/695 |
| 6,134,667 A | * | 10/2000 | Suzuki et al. | 713/300 |
| 6,437,980 B1 | * | 8/2002 | Casebolt | 361/687 |
| 6,438,984 B1 | * | 8/2002 | Novotny et al. | 62/259.2 |
| 6,442,024 B1 | * | 8/2002 | Shih | 361/695 |
| 6,477,055 B1 | | 11/2002 | Bolognia et al. | |
| 6,504,718 B2 | * | 1/2003 | Wu | 361/695 |
| 6,574,100 B1 | | 6/2003 | Anderson | |
| 6,583,989 B1 | | 6/2003 | Guyer et al. | |
| 6,754,076 B2 | * | 6/2004 | Cox et al. | 361/699 |
| 6,776,221 B2 | * | 8/2004 | Montgomery et al. | 165/46 |
| 6,807,056 B2 | * | 10/2004 | Kondo et al. | 361/689 |
| 6,906,919 B2 | * | 6/2005 | Pokharna et al. | 361/687 |
| 2002/0126449 A1 | * | 9/2002 | Casebolt | 361/687 |

(Continued)

OTHER PUBLICATIONS

Web Site: www.intel.com/design/servers/SR1350-E/SR1350e_brief.pdf, printed on Dec. 3, 2003, publication date unknown.

(Continued)

*Primary Examiner*—Boris Chérvinsky
(74) *Attorney, Agent, or Firm*—Richard P. Lange

(57) ABSTRACT

An enclosure forms a plurality of tiers vertically stacked in a longitudinal dimension. Each tier is a 1U modular computer system having a computer chassis configured for mounting in the multi-tiered support, and computer components that need cooling within the computer chassis. A cold plate is in thermal communication with at least one of the computer components, and convectively removes heat from that component using a liquid coolant. A heat exchanger dissipates heat from the liquid coolant, and provides liquid coolant back to the cold plate. An air mover within the chassis cools the heat exchanger, blows air across other components needing cooling, and removes heated air from the chassis. The air mover may extend substantially across the chassis, or it may blow crosswise from an outlet-ventilating direction.

27 Claims, 7 Drawing Sheets

U.S. PATENT DOCUMENTS

| | | | |
|---|---|---|---|
| 2004/0008483 A1* | 1/2004 | Cheon .................... | 361/687 |
| 2004/0095721 A1* | 5/2004 | Ellsworth et al. ........... | 361/694 |
| 2005/0068728 A1* | 3/2005 | Chu et al. .................. | 361/690 |
| 2005/0180105 A1* | 8/2005 | Matsushima et al. ....... | 361/699 |

OTHER PUBLICATIONS

U.S. Appl. No. 10/772,115, filed Feb. 3, 2004, Applicants: Bash, Simon, and Malone.

* cited by examiner

SMALL FORM FACTOR LIQUID LOOP COOLING SYSTEM

The present invention relates generally to multi-tiered, modular rack systems for components and, more particularly, to a cooling system for cooling components in a small form factor chassis mounted in a standardized system rack.

BACKGROUND OF THE INVENTION

Multi-tiered, modular racks are commonly used with groups of modular chassis. Such racks commonly provide each chassis with access to network connections and electrical power. A typical chassis might contain components and interconnecting devices (e.g., printed circuit board cards and wires) that form a computer system such as a server. Each chassis functions to provide an environment relatively free from excessive heat, shock, vibration and/or dust for the computer system. Groups of these computer systems are interconnected to form electronic applications, such as server farms that serve the networking needs of large organizations.

In present-day, standardized racks, 1U "pizza-box" chassis (being approximately 1.7 inches tall, and various lateral sizes such as 19 by 24 inches), each housing a separate computer having one or more CPUs, are found to be useful. In particular, the small form factor (i.e., size) allows for a large number of computers to be vertically stacked, with up to around 40U or 42U, in each rack. The modular nature of each such chassis allows for a given computer system to be swapped out of the network and the rack without interfering with the operation of other computer systems.

Each chassis typically has one or more air movers (e.g., fans) that pump ambient air through the chassis to absorb heat from the components, or from heat sinks attached to the components. In response to demands for networks of high-performance computer systems, components are being designed with increased cooling requirements, and printed circuit boards are being designed with increased component densities. Managing these increased heat-dissipation requirements is complicated by the limited size of the 1U chassis. In particular, the small form factor limits both the available fan sizes and the space for air to flow through the chassis. The limited space typically includes many impediments, such as heat sinks, wires and components, causing significant airflow impedance. As a result, the airflow through the chassis can be significantly limited, thereby limiting the dissipation ability of the chassis cooling system. Furthermore, the tight space configuration can create cooling issues such as hot spots, dead zones and/or insufficient cooling capacity in particular chassis locations.

It will therefore be appreciated that there is a need for a cooling system and apparatus for effectively cooling the heat-dissipating components housed within a 1U chassis in multi-tiered, modular racks. There is also a need for a resulting modular rack system. Preferred embodiments of the present invention satisfy some or all of these needs, and provide further related advantages.

SUMMARY OF THE INVENTION

In various embodiments, the present invention may solve some or all of the needs identified above, providing a rack-mounted 1U chassis having a cooling system configured to cool components. More particularly, the invention provides a modular computer system for mounting in a multi-tiered support. The computer system includes a computer chassis configured for mounting in the multi-tiered support, and one or more computer components within the computer chassis.

To cool the one or more components, the computer system includes a fluid-cooled cold plate, a heat exchanger and an air mover. The cold plate is in thermal communication with the one or more computer components, and is configured to dissipate heat from the one or more components by convectively removing the heat into a stream of liquid coolant, which stays in the liquid state. The heat exchanger is in turn configured to dissipate heat from the liquid coolant routing the cooled liquid coolant back to the cold plate. The air mover is configured to cool the heat exchanger. In many embodiments, the air mover is further configured such that the air cooling the heat exchanger also cools most or all the components that are not cooled by the cold plates.

As described below, embodiments of the invention can include additional features that will provide various advantages in some configurations. One or more small, mechanical coolant pumps may be used to circulate the coolant around the cooling system. The coolant, the cold plates, the heat exchanger, the pump(s) and the connecting tubes may form a closed-loop cooling system that cools each component having high heat-dissipation requirements. A pump could be located in numerous positions along the liquid loop.

Additionally, the computer system may feature a thin, 1U or 2U chassis. The air mover may extend across an intermediate portion of the chassis, and be configured to draw air through the heat exchanger, while blowing air onto other components and out chassis exhaust vents. Alternatively, the air mover can be configured such that it is located by the power supply, and so that it blows crosswise within the chassis, with respect to an outlet ventilation direction. Various aspects of these features can often provide for efficient use of space and power, as well as providing reliability benefits, while being usable with computer systems conforming to typical industry server configurations.

Other features and advantages of the invention will become apparent from the following detailed description of the preferred embodiments, taken with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

DETAILED DESCRIPTION OF THE PREFERRED EMBODIMENTS

The invention summarized above and defined by the enumerated claims may be better understood by referring to the following detailed description, which should be read with the accompanying drawings. This detailed description of particular preferred embodiments of the invention, set out below to enable one to build and use particular implementations of the invention, is not intended to limit the enumerated claims, but rather, it is intended to provide particular examples of them.

Typical embodiments of the present invention reside in a tiered apparatus for supporting, cooling, and connecting or interconnecting a plurality of thin, stackable computer chassis. The tiered apparatus is typically in the form of a multi-tiered modular rack, which can optionally be configured with wiring such that the computer chassis receive power, and interconnect to form networked computer systems or other electronic devices.

Figure 1:
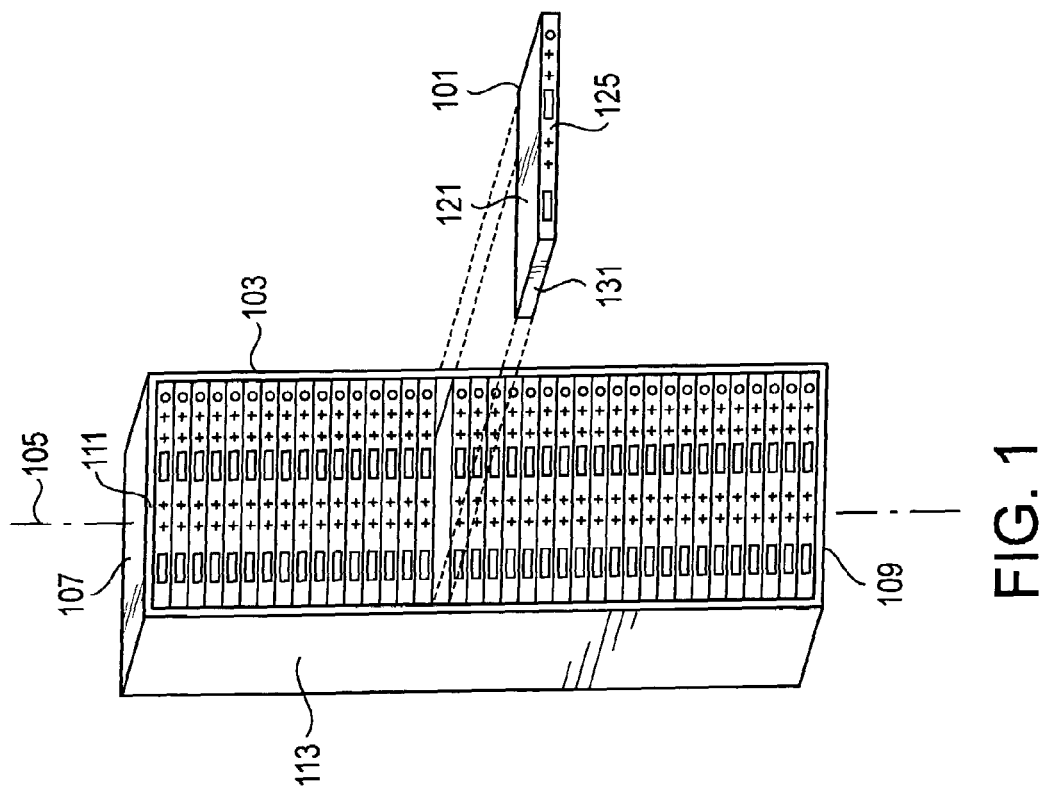
FIG. 1 is a perspective view of a multi-tiered modular rack, with a removed modular chassis, embodying the invention.
Figure 3:
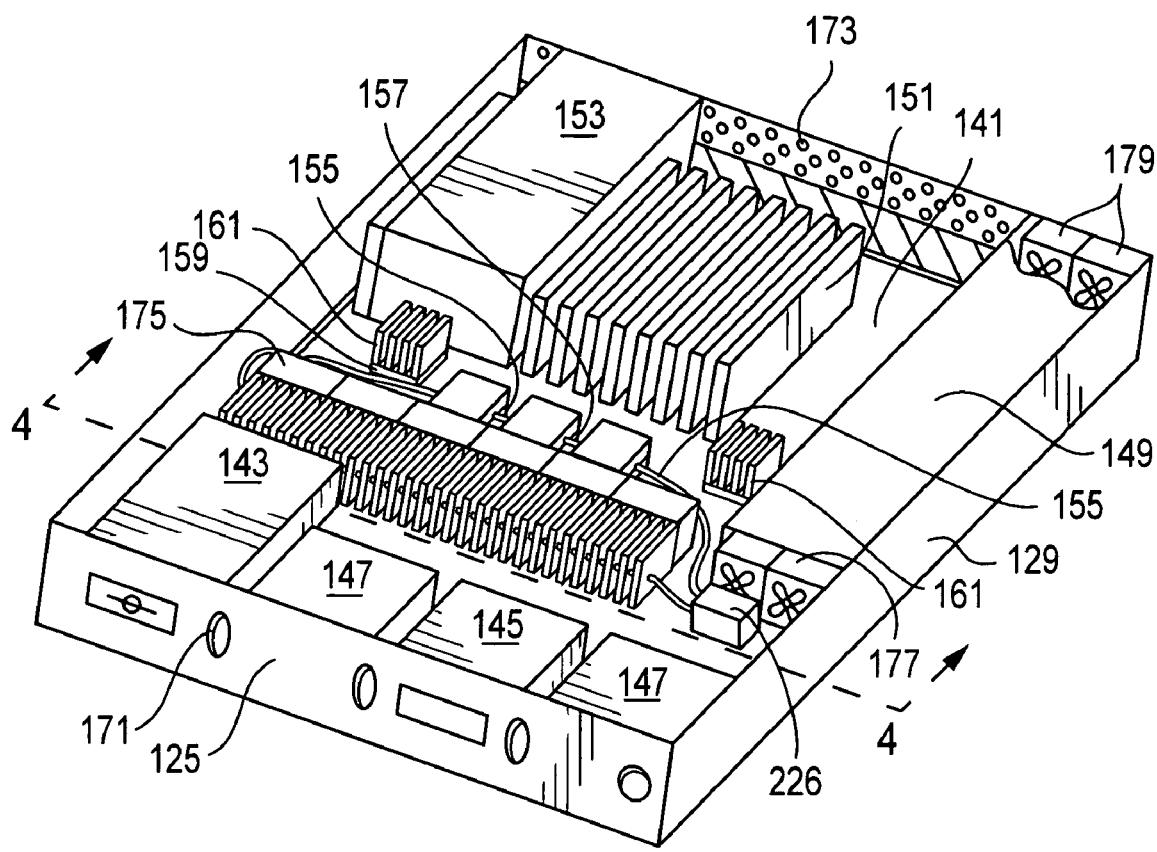
FIG. 3 is a perspective, cutaway view of the removed chassis depicted in FIG. 1.

With reference to FIG. 1, a first embodiment of the present invention is an apparatus forming a tiered structure. More particularly, the embodiment includes a multi-tiered support that is configured to hold a plurality of computer chassis 101. Preferably the multi-tiered support is a conventional modular rack 103 configured for a plurality of 1U servers.

The chassis 101 are stacked in a tier-stacking dimension, which will be referred to as a longitudinal dimension 105. The longitudinal dimension extends between two ends of the stack, a top end 107 and a bottom end 109. In addition to the top and bottom ends, the tiered structure includes four lateral sides: a front side 111 and opposite rear side, and a left side 113 and opposite right side.

With reference to FIGS. 1–4, similar to the modular rack 103, each chassis 101 has opposite longitudinal ends, a top end 121 and a bottom end 123, along (and with respect to) the longitudinal dimension 105. Each chassis also has a front side 125, a rear side 127, a right side 129 and a left side 131, each chassis side and end corresponding to the similarly named sides and ends of the modular rack when the chassis is mounted in the rack. Preferably each chassis is a thin chassis (i.e., thin along the longitudinal dimension 105), typically being a 1U rackmount chassis (i.e., being 1U in height and configured to fit in a standard rack), or alternatively ranging in size up to 2U in height.

Each chassis 101 is configured with a printed circuit board ("PCB") bottom panel 141 to support and/or interconnect one or more electronic assemblies, including a floppy drive 143, a CD and/or DVD drive 145, a plurality of hard disk drives 147, a power supply 149, memory cards 151, input/output ("I/O") units 153, a plurality of central processor units ("CPUs") 155 having high heat-dissipation requirements, other high-dissipation components 157, and some moderate heat-dissipation components 159 (i.e., having moderate heat-dissipation requirements), which may be fitted with heat sinks 161. The power supply adjoins the right and rear sides of the chassis 101. The bottom panel is preferably a printed circuit board wired to interconnect the electronic assemblies to form a computer configured for use as a network server, an application-specific thin server, or the like.

The chassis and modular rack are configured to provide an environment relatively free from excessive shock, vibration and/or dust. In particular, the chassis bottom panel 141, front side 125, rear side 127, right side 129 and left side 131 form five sides of a controlled chassis chamber containing the electronic assemblies. The sixth side may be formed by an additional chassis panel, a panel in the modular rack, or by a bottom panel of a neighboring chassis contiguous with the top end 121 of the chassis 101.

Figure 2:
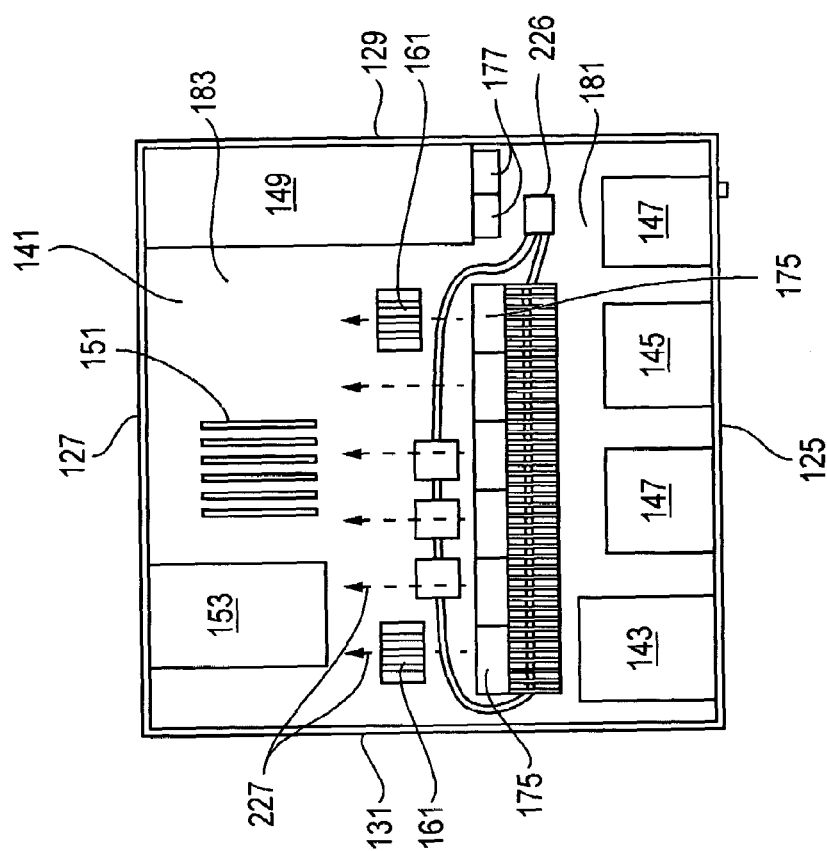
FIG. 2 is a top view of the removed chassis depicted in FIG. 1.

The chassis and its electronic assemblies are also configured with a cooling system to dissipate heat from the electronic assemblies requiring heat dissipation. More particularly, the chassis front side 125 defines intake air vents 171, and the chassis rear side 127 defines exhaust air vents 173. An air mover including a bank of chamber fans 175 extends laterally, substantially across the chassis chamber between the chassis left side 131 and the power supply 149. Additionally, the power supply 149 has dedicated intake fans 177 and exhaust fans 179. The power supply intake fans are roughly aligned (laterally) with the bank of chamber fans (as seen in FIG. 2). All of the fans, including the chamber fans, the power supply intake fans and the power supply exhaust fans, blow in a rearward direction. Optionally, the air mover can extend fully across the chassis, and optionally include some of the power supply fans, such as the dedicated intake fans 177.

The power supply is fully enclosed such that the dedicated intake fans 177 and exhaust fans 179 control and direct all the cooling airflow entering and exiting the power supply. The intake fans 177 draw air from within the chassis chamber, and the exhaust fans 179 blow air from within the power supply directly through vents in the rear side 127 of the chassis, thus preventing the hot air from the power supply from reaching other portions of the chassis.

The bank of chamber fans 175 and the power supply divide the chassis chamber such that, excluding the power supply, the chassis chamber forms two chambers, an upstream chamber 181 and a downstream chamber 183. The bank of chamber fans 175 draws air from the upstream chamber and blows it into the downstream chamber, thereby forcing air in the upstream chamber to flow through the downstream chamber and out the exhaust vents 173.

The suckion of the chamber fans draws outside air into the upstream chamber through the intake air vents 171, and possibly through the floppy drive 143, the CD and/or DVD drive 145, and the plurality of hard disk drives 147. This outside air can provide some heat dissipation to the floppy drive 143, the CD and/or DVD drive 145, and the plurality of hard disk drives 147.

While some air may flow backward from the downstream chamber to the upstream chamber, a significant amount of air in the downstream chamber is exhausted out the exhaust air vents 173, thus transferring the heat removed from the liquid stream to a location outside of the chassis. Optionally, the upstream chamber and downstream chamber can be separated by flow guides or a partition to prevent air from flowing back from the downstream chamber to the upstream chamber.

Figure 4:
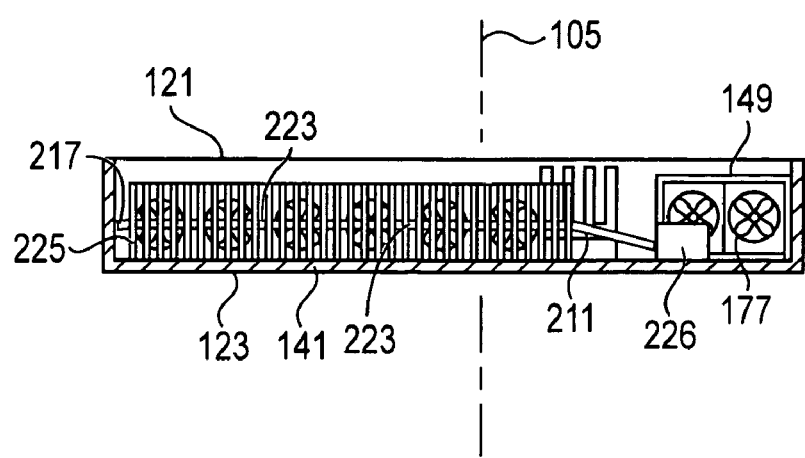
FIG. 4 is a front, cross sectional view of the removed chassis depicted in FIG. 1, taken along line 4—4 of FIG. 3.
Figure 5:
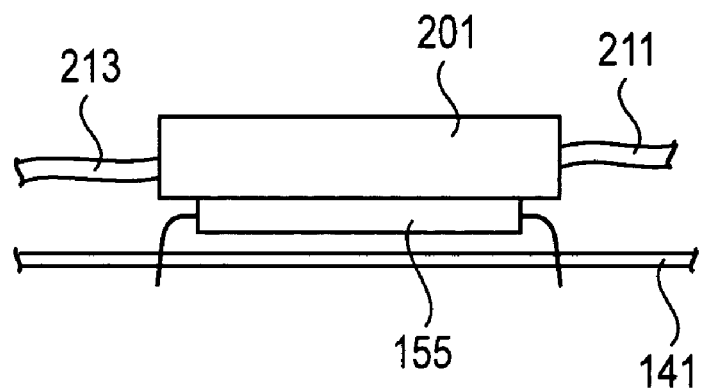
FIG. 5 is a front view of a CPU and an cold plate contained in the removed chassis depicted in FIG. 1.
Figure 6:
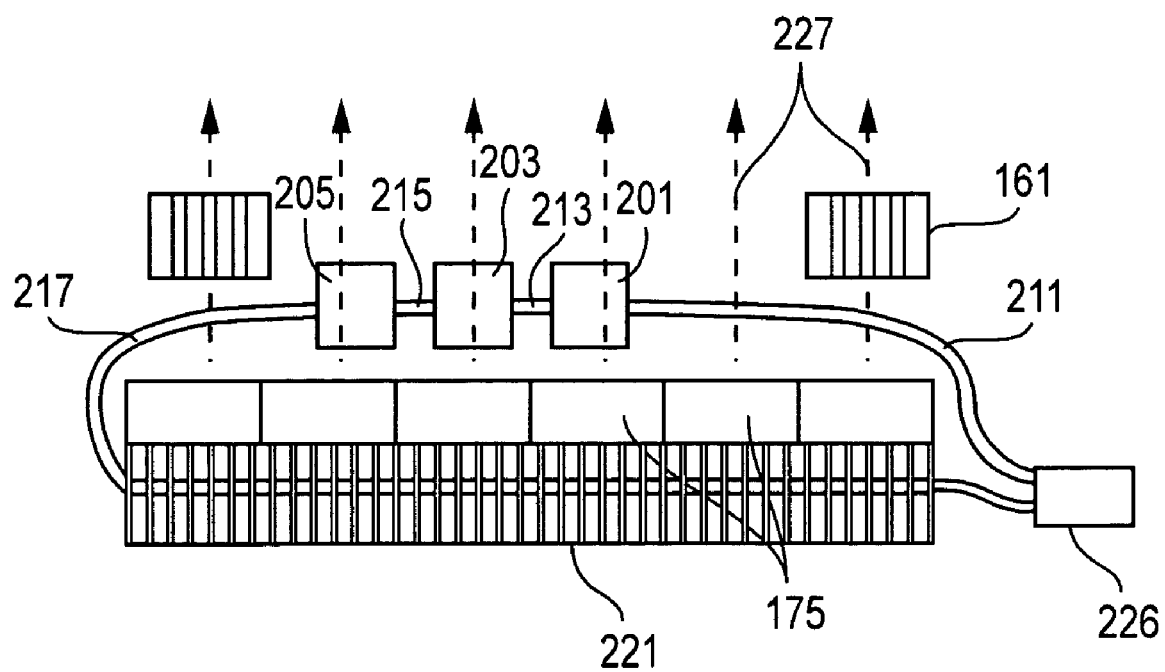
FIG. 6 is a top view of a cooling system contained in the removed chassis depicted in FIG. 1.

With reference to FIGS. 4–6, the chassis cooling system includes a first cold plate 201, a second cold plate 203 and a third cold plate 205. The first and third cold plates, 201 and 205, are each affixed to one of the CPUs 155, and the second cold plate 203 is affixed to the other high-dissipation component 157, thus all three cold plates are affixed to components having high heat-dissipation requirements. The cold plates are affixed in a manner placing them in thermal communication with their respective components so that they can dissipate heat from the components.

The cold plates may be any of a variety of types wherein a stream of liquid coolant flowing through the cold plate is used to absorb heat, and the resulting heated liquid coolant removes the heat from the cold plate. More particularly, the cold plates are each configured to conduct heat from its respective component, and are further configured to be convectively cooled by the stream of liquid coolant, which flows in to and out of the cold plate without undergoing a state change.

The stream of liquid coolant is received into the first cold plate 201 via a first tube 211. Heat from the first cold plate's respective CPU 155 is conductively dissipated into the first cold plate. The stream of liquid coolant from the first tube 211 cools the first cold plate, and convectively removes the CPUs dissipated heat from the first cold plate. The stream of liquid, heated by the first cold plate, passes through a second tube 213 to be received in the second cold plate 203.

Heat from the other high-dissipation component 157 is conductively dissipated into the second cold plate. The stream of liquid coolant from the second tube 213 cools the second cold plate, and convectively removes the high-dissipation component's dissipated heat from the second cold plate. The stream of liquid, heated by the first and second cold plates, passes through a third tube 215 to be received in the third cold plate 205.

Heat from the third cold plate's respective CPU 155 is conductively dissipated into the third cold plate. The stream of liquid coolant from the third tube 215 cools the third cold plate, and convectively removes the dissipated heat from the third cold plate. The stream of liquid, heated by the first, second and third cold plates, passes through a fourth (and last) tube 217.

The stream of liquid coolant, having been heated in the first, second and third cold plates, passes through the fourth tube 217 to be received by a heat exchanger 221. The heat exchanger can be any of a plurality of types, and may define one or more passageways 223 that are thermally connected to a plurality of cooling fins 225. The passageways are configured to dissipate heat from the stream of liquid coolant to the fins, and thereby cool the liquid coolant as it passes through the heat exchanger. This cooled stream of liquid coolant exits the heat exchanger through the first tube 211 and passes back toward the first cold plate 201. The passageways 223 and fins 225 are sized and configured to adequately dissipate the heat convectively removed from the CPUs 155, the other high-dissipation component 157, and their respective cold plates, by the coolant.

A small, mechanical coolant pump 226 is used to pump coolant such that it circulates around the cooling system. The pump is a separate device, but could be integral with another component of the system, such as the heat exchanger and/or the cold plates. The pump could optionally be located at various positions throughout the liquid loop of the cooling system. The pump, the coolant, the cold plates, the heat exchanger, and the connecting tubes form a closed-loop cooling system that cools each component having high heat-dissipation requirements in series.

The cooling fins 225 of the heat exchanger are positioned in the upstream chamber 181, next to an intake side of the bank of chamber fans. The bank of chamber fans thus serves as an air mover configured to draw air through the fins. The air drawn through the fins is heated by the fins, thereby dissipating the fins' heat and cooling the heat exchanger (and the coolant contained inside the heat exchanger passageways 223).

Alternatively, the cooling fins of the heat exchanger could be positioned in the downstream chamber, downstream of the bank of chamber fans. The fans would then blow across and through the heat exchanger. In either case, the bank of chamber fans thus serves as an air mover configured to draw air through the fins. Also, in either case it may be preferable to provide a small space between the bank of chamber fans and the heat exchanger, thus forming a plenum. Ducting would be provided to assure that essentially all of the blown air passes through the fins (either before or after passing through the bank of fans). This plenum may provide for more evenly distributed airflow through the fins.

The bank of cooling fans 175 blows across the downstream chamber 183, which contains the memory cards 151, the I/O units 153, the plurality of CPUs 155, the other high-dissipation component 157, and the moderate heat-dissipation components 159, as well as any other components that require any significant cooling. Preferably, all cards in the downstream chamber (such as the memory cards), and the fins of all heat sinks 161 in the downstream chamber, are aligned with airstreams 227 (see, FIGS. 2 and 6) blowing from the bank of cooling chamber fans 175 so as to directly receive those airstreams, or at least directly receive airflow caused by those airstreams, without causing an unnecessary impediment. The airstreams and/or airflow can then provide some cooling to cards and components in the downstream chamber.

As a result of the above-described configuration, the high-dissipation components, including the CPUs, are convectively cooled by a liquid coolant, with their heat being dissipated by air drawn from the upstream chamber 181. Most of the components in the downstream chamber 183 are cooled by air from the upstream chamber moving through the downstream chamber, and most of those are cooled by being directly blown upon with air from the upstream chamber by the bank of cooling fans 175. The power supply 149 is separately cooled using air drawn from the upstream chamber. All components in the upstream chamber are preferably cooled by air drawn by or through the components due to the lower pressure in the upstream chamber.

Advantageously, the modular rack 103 can typically also house chassis lacking any type of liquid cooling. Additionally the modular rack might also house chassis including a closed-loop, evaporative cooling system, as described in U.S. patent application Ser. No. 10/772,115, filed Feb. 3, 2004 ("the evaporative cooling system"), which is incorporated herein by reference for all purposes.

In some cases, specific designs of the above-described embodiments might be constrained such that the heat-exchangers and/or air movers cannot, or preferably would not, extend integrally, and/or extend substantially or entirely across the chassis. Therefore, variations of these embodiments may be designed with additional features that accommodate such preferences.

Figure 7:
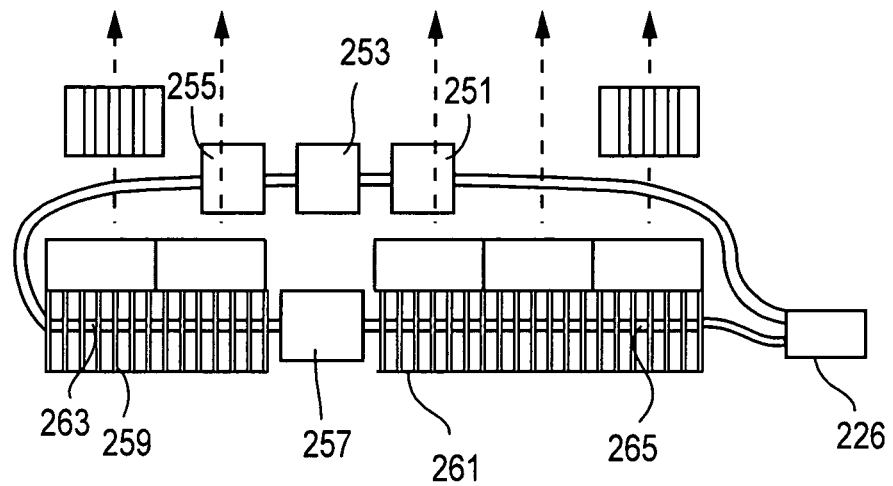
FIG. 7 is a top view of a cooling system, contained in a variation of the removed chassis depicted in FIG. 1.

A first variation of this embodiment is provided with a heat exchanger having separate first and second heat-exchanger portions. The passageways of the first and second heat-exchanger portions may directly connect via a tube. Alternatively, the first and second heat-exchanger portions might be situated in different portions of the liquid-loop, each heat-exchanger portion having passageways that are separated from the passageways of the other, on both ends of the passageways, by one or more cooling devices (such as cold plates or evaporative cooling devices) configured to cool components having high-dissipation requirements. For example, with reference to FIG. 7, a first variation of the first embodiment might include a first cold plate 251, a second cold plate 253, a third cold plate 255 and a fourth cold plate 257, along with a first heat-exchanger portion 259 and a second heat-exchanger portion 261. Passageways 263 through the first heat-exchanger portion are separated from passageways 265 through the second heat-exchanger portion by the first, second and third cold plates and one end of the passageways, and by the fourth cold plate at the other end of the passageways.

A second variation of this embodiment is configured with cold plates arranged in a parallel configuration. This feature would typically have lower flow rates through each such parallel cold plate, but would provide each such cold plate to operate with substantially the same inlet temperature. Also, the flow resistance would be lower, potentially allowing for greater coolant flux and greater heat transfer for a given pump operating at a given power level, and/or allowing for lower pump power requirements.

A third variation of this embodiment is further configured with a reservoir in the liquid loop. The reservoir could be immediately prior to the pump along the coolant flow pat, and could be integral with another component of the system, such as the pump or the heat exchanger. Among other functions, the reservoir can be configured such that it serves to remove any air bubbles or contaminants from the coolant flow path, thereby increasing the system fault tolerance.

Figure 8:
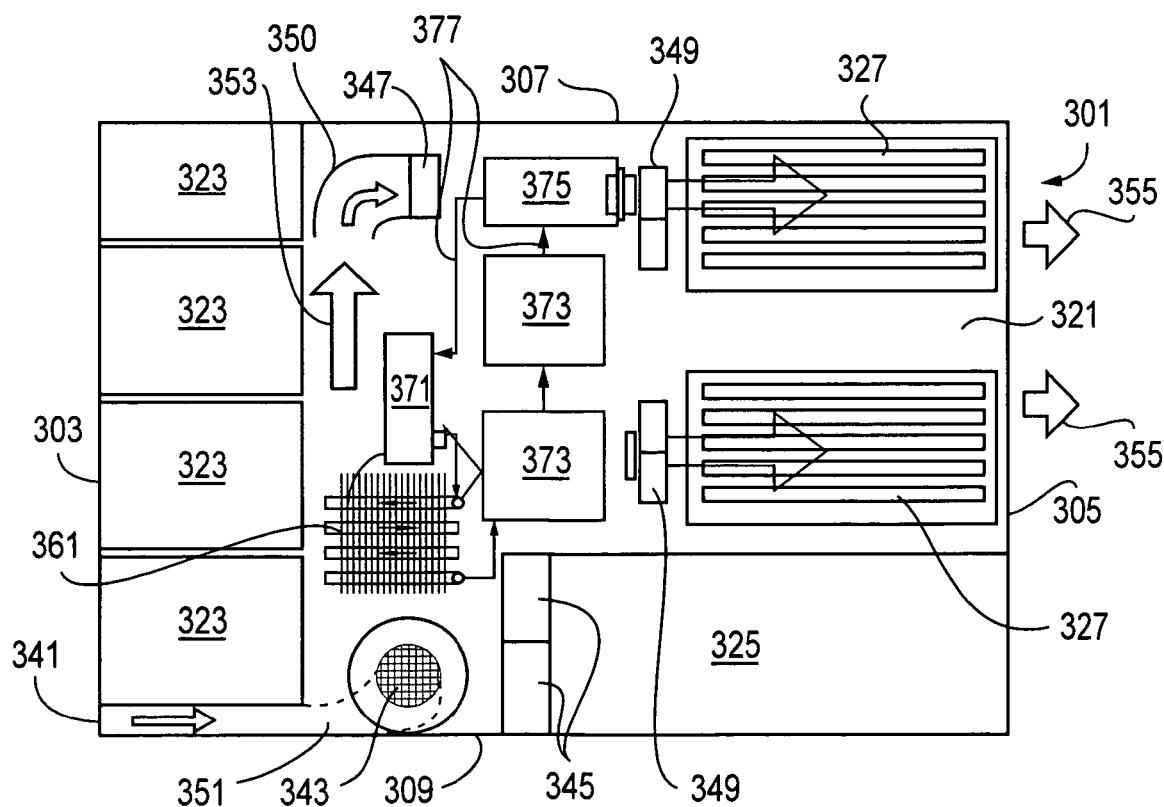
FIG. 8 is a top view of a second embodiment of the removed modular chassis depicted in FIG. 1.

With reference to FIG. 8, a second embodiment of the invention is an apparatus forming a tiered structure, including a multi-tiered support that is configured to hold a plurality of computer chassis including depicted chassis 301. Similar to the first embodiment, the multi-tiered support defines a longitudinal dimension, and is preferably a conventional modular rack configured for a plurality of 1U servers. The chassis 301 preferably has a top end and opposite bottom end, a front side 303 and opposite rear side 305, and a left side 307 and opposite right side 309.

The chassis 301 is preferably provided with a PCB bottom panel 321 to support and/or interconnect one or more electronic assemblies, including drives 323, a power supply 325, cards 327, and a plurality of computer components including a plurality of CPUs and other high-dissipation components such as a power converter. The power supply adjoins the right and rear sides of the chassis. The plurality of computer components also include some moderate heat-dissipation components, some of which could be fitted with heat sinks.

The chassis and its electronic assemblies are also configured with a cooling system to dissipate heat from the electronic assemblies requiring heat dissipation. More particularly, the chassis front side 303 defines an intake air vent 341 near one side (e.g., the right side 309), and the chassis rear side 305 defines exhaust air vents (similar to the first embodiment). The chassis is provided with a high-volume air mover 343. Additionally, the power supply 325 has dedicated intake fans 345 and exhaust fans (not shown).

The chassis might include additional region-specific fans, such as one or more flow guide fans 347, and one or more card-cooling fans 349. These region-specific fans provide additional control over regional airflow, so as to provide adequate cooling throughout all regions requiring such cooling. Additional flow control can also come from flow guide partitions 350, which can be placed adjacent to the intake or outlet sides of the fans or the blower to better control air movement within the chassis. All of the fans preferably blow in a rearward direction, but other configurations might be appropriate for particular regional needs within the chassis.

The air mover 343 is preferably a low-profile, centrifugal blower that axially receives air that was received from the intake vent via an intake manifold 351, and that expels it in a circumferential direction. More particularly, the air enters the intake manifold from the intake vent, and then flows substantially under the blower. From the manifold, the air flows axially up or down into a center portion of the air mover in the longitudinal dimension 105, which is normal to the primary plane of the chassis. The air mover is configured to blow in a crosswise direction 353 (e.g., at substantially a right angle) to an exhaust direction 355 (i.e., a direction normal to the side defining the outlet vents, which is the rear side 305 as depicted). As a result, the cross-blown air is blown in a direction substantially parallel to side defining the outlet vents.

The crosswise direction 353 is also at a substantially right angle to an intake vent entry direction (i.e., a direction normal to the side defining the intake vent 341, which is the front side 303 as depicted), such that the cross-blown air is blown in a direction is parallel to side defining the intake vent. The crossblown air is stopped by the opposite side wall, and turns toward the exhaust vents. As a result of the crosswise flow of the cross-blown air, the region of the chassis into which the air is directly blown acts as a plenum, turning and distributing the air through the remaining portion of the chassis between the plenum and the exhaust vents.

The high-volume air mover 343 preferably provides for efficient heat transfer using a heat exchanger 361 that is located next to the air mover in the path of the blown air, and that preferably does not extend across the full width of the chassis. This configuration provides for various types of chassis architecture, while limiting cooling dead zones (areas having little airflow for cooling). Optionally, the liquid-cooled components are located in the primary locations having limited airflow for cooling.

Preferably, the air mover 343 is positioned such that all significantly air-cooled components (i.e., all components that requiring cooling by more than relatively stagnant air, and that are not cooled using the liquid loop), are either positioned directly within a cross-blown zone defined by the relatively linear, crosswise path of the cross-blown air, are cooled by region specific fans, and/or are positioned in the region between the cross-blown zone and the outlet vents. This region between the cross-blown zone and the outlet vents will typically have significant airflow toward the outlet vents.

Furthermore, preferably the power supply 325 is located between the air mover 343 and the side defining the outlet vents, which will typically limit the development of cooling dead zones. The power supply 325 is preferably fully enclosed such that the dedicated intake fans 345 and exhaust fans control and direct all the cooling airflow through the power supply. The intake fans draw air from within the chassis chamber, and the power supply exhaust vents vent air through the rear side 305 of the chassis, thus preventing the hot air from the power supply from reaching other portions of the chassis.

Similar to the first embodiment, the second embodiment includes a pump 371, cold plates (e.g., CPU cold plates 373 on the CPUs, and other-device cold plates 375 on the power converter), tubes 377 and any other components necessary for a liquid-loop cooling system. Like the first-described embodiment, modular racks configured for this embodiment might also receive typical air-cooled chassis, as well as receive chassis that are configured with an evaporative cooling system as incorporated above by reference.

Figure 13:
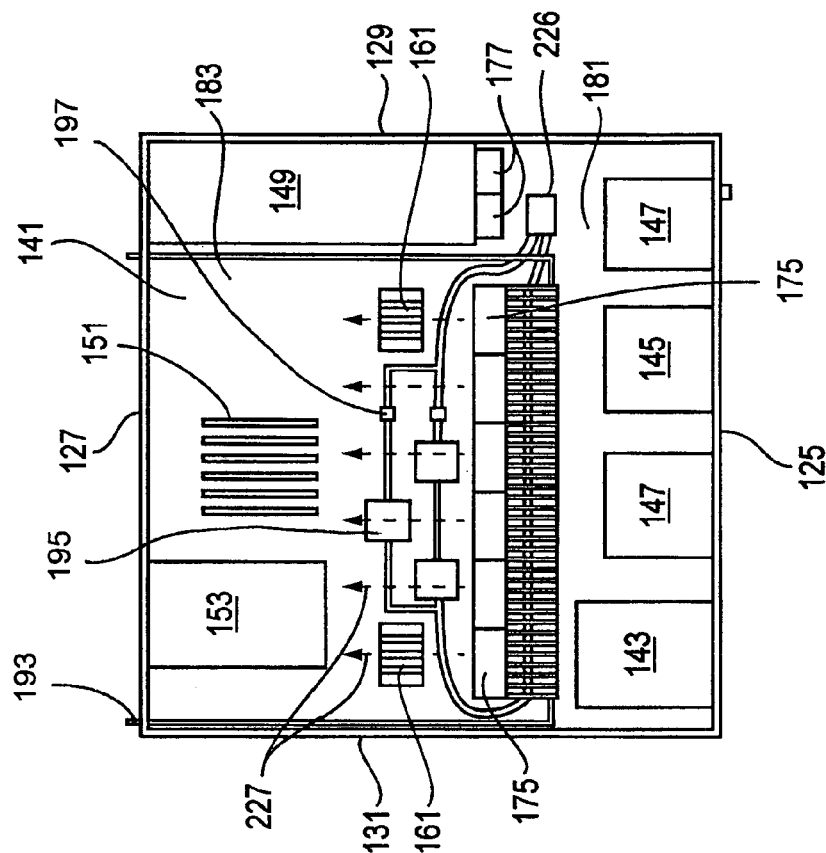
FIG. 13 is a top view of a variation of the removed chassis depicted in FIG. 1.

With reference to FIG. 13, in a second variation, which is applicable to the first or second embodiments, may be similar to the first or second embodiments in many features. This variation differs in that rather than (or supplemental to) drawing in ambient air to cool components, a source of chilled fluid such as air or another gaseous fluid (or conceivably even a liquid fluid for an appropriate application) is in fluid communication with the chassis, preferably via passageways 193 within the rack. The chilled fluid preferably enters the upstream chamber 181 of the first embodiment, or the air mover intake manifold of the second embodiment, so as to pass through the heat exchanger. Similar to as noted above, modular racks configured for embodiments of this variation might also receive typical air-cooled chassis, as well as receive similarly configured chassis (e.g., chassis configured to recieve chilled air from a rack) that lack any type of liquid cooling, or that are configured with an evaporative cooling system as incorporated above by reference.

In some additional variations of the first or second embodiments, the air-cooled heat exchanger could be replaced with a heat exchanger of other design. For example, in a third variation, the heat exchanger could be cooled with a liquid. The liquid would preferably enter and exit the chassis through tubes and chassis connection ports that connect up to rack connection ports on the modular rack, the chassis and rack ports preferably connecting automatically upon the insertion of the chassis into the rack. The modular rack could be configured with rack ports for chassis located in each chassis-position within the rack. The rack ports are configured with lines forming liquid passageways connecting the various chassis in the rack into a rack liquid loop, either in parallel (typically for efficient cooling) and/or in series (typically to limit cost and space requirements).

Figure 12:
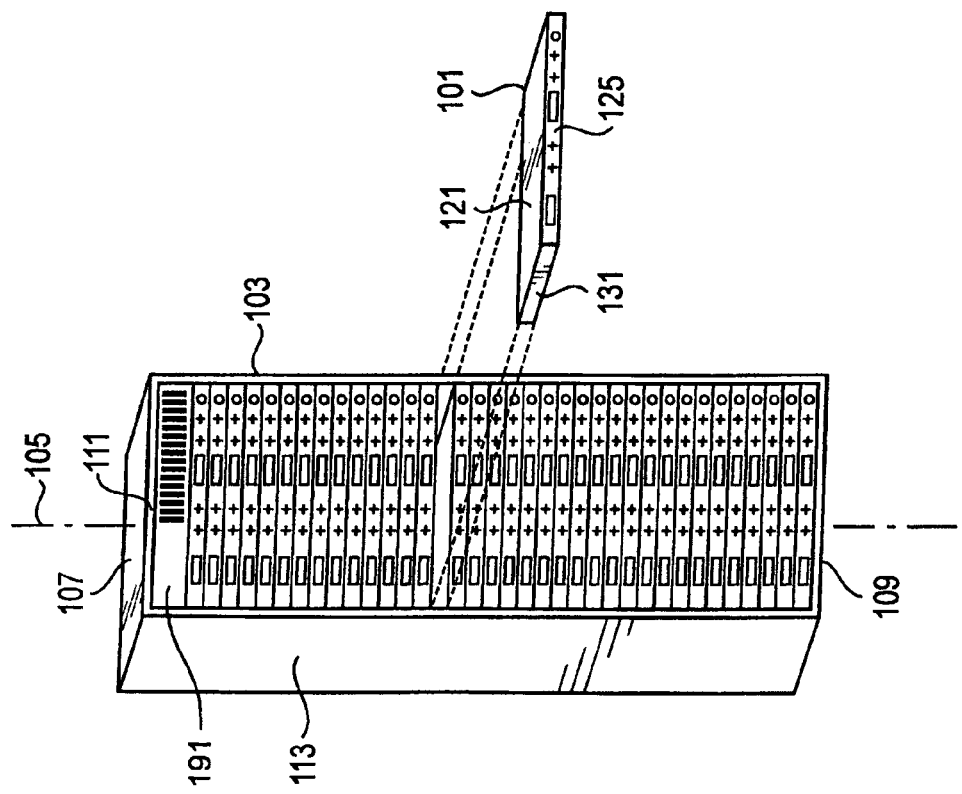
FIG. 12 is a perspective view of a variation of the multi-tiered modular rack depicted in FIG. 1.

With reference to FIG. 12, the modular rack liquid loop could include a heat sink 191 that is external to the plurality of chassis, and possibly external to the rack. The heat sink is preferably configured to dissipate heat from all the chassis connected into the rack liquid loop. The rack liquid loop could be exclusive to the modular rack, or it could encompass a plurality of modular racks interconnected in series and/or in parallel. Similar to as noted above with regard to the first-and second-described embodiments, modular racks configured for these embodiments might also receive typical air-cooled chassis, as well as receive similarly configured chassis (e.g., chassis configured with a liquid-cooled heat exchanger) with an evaporative cooling system as incorporated above by reference.

A fourth variation is similar to the third, except that a rack having a closed liquid loop is not used. More particularly, the heat sink is replaced with an endless supply of liquid (e.g., a water line) and a liquid exhaust for disposing of heated liquid. Like the first-and second-described embodiments, modular racks configured for this variation might also receive typical air-cooled chassis, as well as receive similarly configured chassis (e.g., chassis configured with a liquid-cooled heat exchanger) with an evaporative cooling system as incorporated above by reference.

A fifth variation is also similar to the third, except that the heat exchanger is cooled with a refrigerant. More particularly, the heat exchanger is configured to be evaporatively cooled by refrigerant that is in turn re-condensed in an external heat exchanger external to the chassis, and possible external to the rack (similar to the heat sink of the second variation). Like the first- and second-described embodiments, modular racks configured for this variation might also receive typical air-cooled chassis, as well as receive similarly configured chassis (e.g., chassis configured with a refrigerant-cooled heat exchanger) with an evaporative cooling system as incorporated above by reference.

Figure 11:
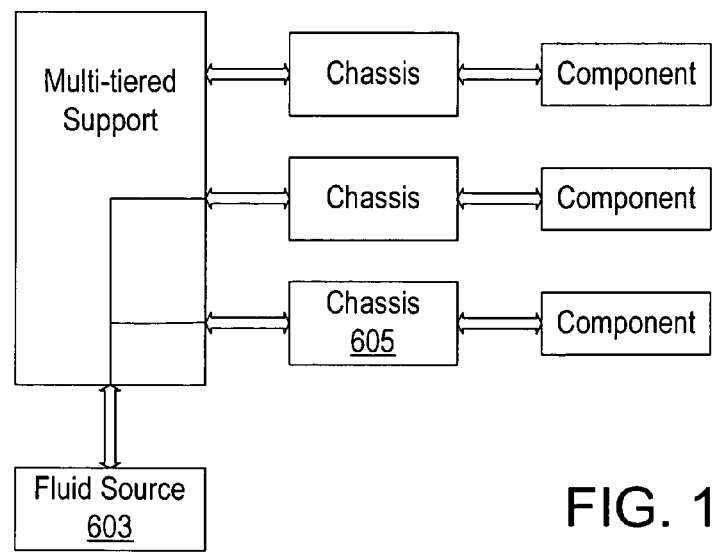
FIG. 11 is a block diagram of a second variation of the first embodiment, depicted in FIG. 1.

With reference to FIG. 11, a sixth and seventh variation of the first and second embodiments are similar to the fifth, except that the chassis heat exchanger is eliminated. Instead, the coolant tubes directly connect the chassis 605 cold plates to chassis ports, which place the cold plates in fluid communication with a fluid source 603 that is either an external heat exchanger (in the fifth variation) that is external to the chassis, and possibly external to the rack, or to an endless supply of coolant (in the sixth variation). Like the first-and second-described embodiments, modular racks configured for these embodiments might also receive typical air-cooled chassis, as well as receive similarly configured chassis (e.g., chassis lacking a heat exchanger) with an evaporative cooling system as incorporated above by reference.

As appropriate, a modular rack might be configured for multiple types of the above-described chassis. Additionally, the fourth through seventh variations, like the third variation, can be configured for multiple racks to be interconnected within a single cooling system.

Figure 9:
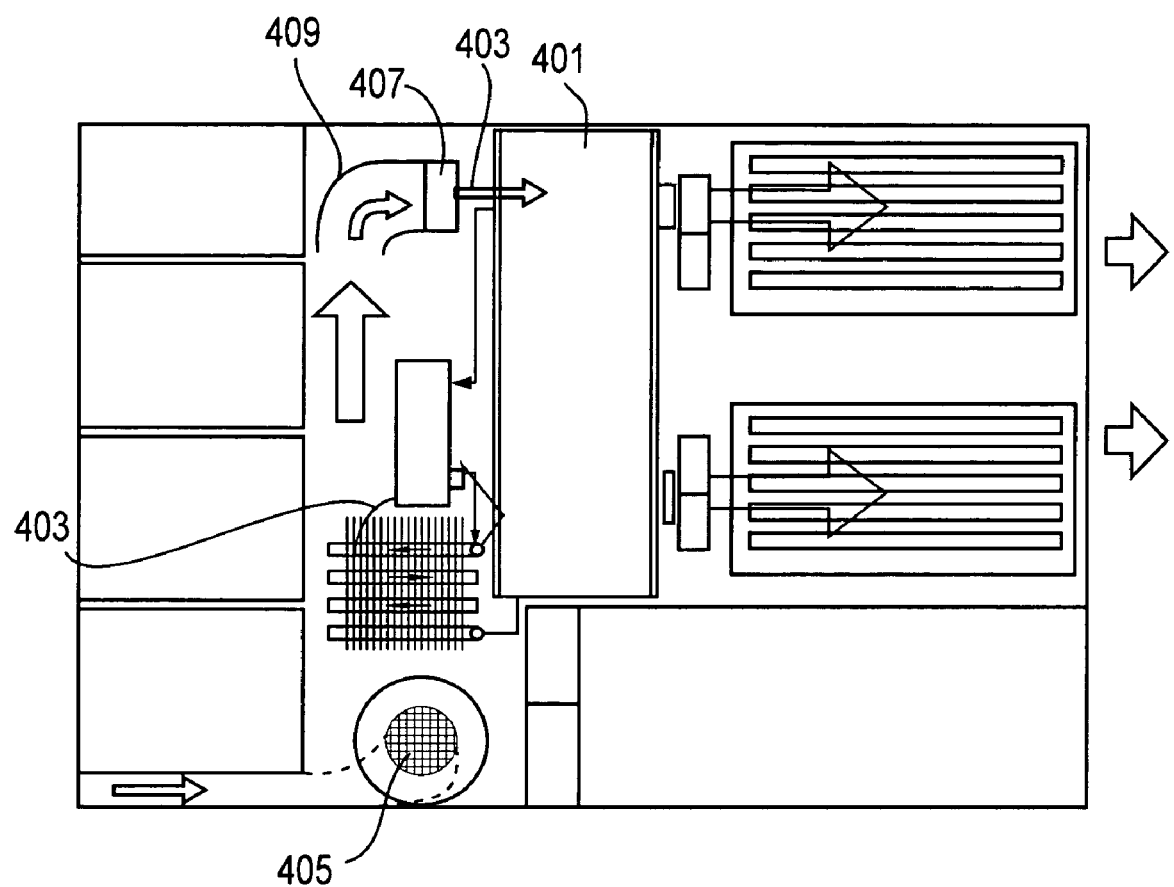
FIG. 9 is a top view of a variation of the embodiment depicted in FIG. 8.

An eighth variation, which is applicable to above-described embodiments and variations, may be similar to the first or second embodiments in many features. As depicted in FIG. 9, some or all of the components cooled by the cold plates are covered by a component cover 401. Airflow 403 from blowers 405, flow guide fans 407 and flow guide partitions 409 pass over the cover. The cover limits disturbance of the airflow over the cold plates and the cooled components, and also limits the heating of the airflow passing over the components by the components and cold plates.

A ninth variation, which is applicable to above-described embodiments and variations, may be similar to the first or second embodiments in many features. This variation includes a control system 521 (see FIG. 10) configured to control the level of cooling provided to the components cooled by the cold plates, and/or to the air-cooled components. Optionally, the control system can be configured to control the operating power levels of the air mover, of the fans and other air-movement devices, and/or of the pump, so as to control level of cooling.

With reference to FIG. 13, for cold plates 195 arranged in parallel, the tubing optionally can be configured with valves 197 or supplementary pumps such that the rate of rate of flow between parallel branches of the cooling system can be separately and individually controlled. The control system is thus configured to control the relative rate of coolant flow to the parallel cold plates (and their respective components). As a result, the cooling system can be operated at the lowest power level necessary to deliver adequate cooling to each heat-critical component.

The control system of the ninth variation can be configured to operate based on any available indices of component cooling requirements. Such indicia could include component usage levels, component internal sensors, and external sensors configured for sensing the component cooling needs (e.g., temperature). Furthermore, the control system can be provided in hardware and/or software within the chassis, and/or it can be partially or totally external to the chassis. In the later case, it can optionally be configured to control the cooling of components within a number of chassis.

While the depicted enclosure of the first embodiment appeared as a unitary rack with laterally inserted chassis, it is to be understood that other configurations, such as modular structures that can be modularly disassembled, are within the scope of the invention. For example, each chassis could be configured as a stackable module with connectors that provide electrical and electronic connections for other chassis in the stack, allowing for a structure of configurable longitudinal height.

While providing good heat-removal characteristics, the apparatus is preferably configured with features known for typical rackmount enclosures, providing shock, vibration and/or dust protection. For example, the external openings (e.g., the vents) are preferably well shielded from the components, providing good shielding against electromagnetic radiation.

It is to be understood that the invention comprises apparatus and related methods for designing and for producing cooling enclosures, as well as the apparatus and cooling methods of the enclosures themselves. Additionally, various embodiments of the invention can incorporate various combinations of the above described embodiment features (e.g., a mechanical coolant pump could be used in a cooling system where the cold plates are connected in parallel). In short, the above disclosed features can be combined in a wide variety of configurations within the anticipated scope of the invention.

While particular forms of the invention have been illustrated and described, it will be apparent that various modifications can be made without departing from the spirit and scope of the invention. For example, while typical electronic computer components have been described, the cooling of other components such as optical devices and the like are within the scope of the invention. Thus, although the invention has been described in detail with reference only to the preferred embodiments, those having ordinary skill in the art will appreciate that various modifications can be made without departing from the scope of the invention. Accordingly, the invention is not intended to be limited by the above discussion, and is defined with reference to the following claims.

We claim:

1. A modular computer system for mounting in a multi-tiered support, and configured to use a liquid coolant, comprising:
   a computer chassis configured for mounting in the multi-tiered support;
   a first computer component within the computer chassis;
   a first cold plate in thermal communication with the first computer component, the first cold plate being configured to conduct heat from the first component, and further configured to be convectively cooled by the coolant;
   a second computer component within the chassis; and
   a second cold plate in thermal communication with the second computer component, the second cold plate being configured to conduct heat from the second component, and further configured to be convectively cooled by the coolant
   a heat exchanger configured to dissipate heat from the coolant, wherein the first and second cold plates and the heat exchanger form at least part of a closed-loop cooling system;
   a coolant pump configured to pump the coolant through the closed-loop cooling system; and
   a control system configured to control the level of cooling provided to the first and second computer components;
   wherein the cooling system is configured to deliver coolant to the first and second computer components in parallel; and
   wherein the control system is configured to control the relative rate of coolant flow to the first and second computer components.

2. The modular computer system of claim 1, and further comprising an air mover configured to cool the heat exchanger.

3. The modular computer system of claim 2, wherein the air mover is further configured to pump air heated by the heat exchanger out one or more exhaust vents in the chassis.

4. The modular computer system of claim 2, wherein:
   the air mover is a plurality of fans extending across an intermediate portion of the chassis to define two chambers, the fans being configured to move air from a first chamber of the two chambers to a second chamber of the two chambers; and
   chassis exhaust vents ventilate the second chamber.

5. The modular computer system of claim 2, and further comprising one or more additional computer components within the computer chassis, wherein the air mover causes airflow that directly cools the one or more additional components.

6. The modular computer system of claim 5, wherein the air mover blows directly toward the one or more additional computer components.

7. The modular computer system of claim 5, wherein the air mover draws air through the heat exchanger, and blows air toward the one or more additional computer components.

8. The modular computer system of claim 2, wherein the air mover configured to blow in a crosswise direction to an exhaust direction.

9. The modular computer system of claim 2, and further comprising a first component cover configured to cover the first cold plate such that it limits disturbance of airflow over the cooled first cold plate.

10. The modular computer system of claim 1, wherein the chassis is a 1U rackmount chassis.

11. The modular computer system of claim 1, wherein the control system is further configured to control the operating power of the pump.

12. A modular computer system for mounting in a multi-tiered support, comprising:
    a computer chassis configured for mounting in the multi-tiered support;
    a first computer component within the computer chassis;
    a means for convectively removing heat from the first computer component using a liquid coolant;
    a second computer component within the computer chassis;
    a means for convectively removing heat from the second computer component using the liquid coolant;
    a means for removing heat from the coolant;
    a means for transferring the heat that was removed from the coolant, out of the chassis; and
    a control system configured to control the level of cooling provided to the first and second computer components;
    wherein the control system is configured to control the relative level of cooling between the first and second computer components.

13. A method for cooling a modular computer system including a computer chassis containing a first computer component and a second computer component, mounted in a multi-tiered support, comprising:
    mounting the computer chassis in a multi-tiered support;

convectively removing heat from the first and second computer components using a liquid coolant;

controlling the relative level of cooling between the first and second computer components;

removing heat from the coolant using a heat exchanger; and transferring the heat removed from the fluid out of the chassis.

14. The method of claim 13, wherein the chassis is a 1U rackmount chassis.

15. The method of claim 13, wherein the chassis is less than or equal to 2U in height.

16. A modular computer system configured to use a liquid coolant, comprising:

a multi-tiered support; and the modular computer system of claim 1 mounted in the multi-tiered support.

17. A modular computer system for mounting in a multi-tiered support, and configured to use a liquid coolant, comprising:

a computer chassis configured for mounting in the multi-tiered support;

a plurality of computer components within the computer chassis; and a closed-loop cooling system including a plurality of cooling devices and a heat exchanger, wherein the plurality of cooling devices are configured to transfer heat from the plurality of computer components to a stream of coolant, wherein the heat exchanger is configured to dissipate heat from the coolant, and wherein the heat exchanger includes a first heat-exchanger portion and a second heat-exchange portion, the first and second heat-exchange portions having coolant passageways separated from one another at both of two different ends by one or more of the plurality of cooling devices.

18. A modular computer system configured to use a liquid coolant and a fluid, comprising:

a multi-tiered support configured with a plurality of connections for connecting to a plurality of computer chassis, wherein the multi-tiered support defines passageways configured to deliver the fluid to each computer chassis connection;

a computer chassis configured to mount in the multi-tiered support, being further configured to connect to a connection of the plurality of connections, and to receive the fluid from the connection;

a computer component within the computer chassis;

a cold plate in thermal communication with the computer component, the cold plate being configured to conduct heat from the component, and further configured to be convectively cooled by the coolant;

a heat exchanger within the computer chassis configured to dissipate heat from the coolant, wherein the cold plate and the heat exchanger form at least part of a closed-loop cooling system; and a coolant pump configured to pump the coolant through the closed-loop cooling system;

wherein the computer chassis includes passageways configured for cooling the heat exchanger with the fluid received from the connection.

19. The modular computer system of claim 18, wherein the fluid is a chilled gaseous fluid.

20. The modular computer system of claim 18, wherein the fluid is a liquid.

21. The modular computer system of claim 20, and further comprising a heat sink external to the plurality of chassis and configured to cool the fluid.

22. The modular computer system of claim 21, wherein the heat sink is exclusively used to cool fluid heated used within the multi-tiered support.

23. The modular computer system of claim 21, wherein the heat sink is used to cool fluid heated in a plurality of multi-tiered supports.

24. The modular computer system of claim 20, wherein the multi-tiered support receives fluid from a substantially endless fluid supply.

25. The modular computer system of claim 18, wherein:

the fluid is a refrigerant;

the heat exchanger is evaporatively cooled with the refrigerant; and the refrigerant is re-condensed in an external heat exchanger.

26. A modular computer system configured to use a coolant, comprising;

a multi-tiered support configured with a plurality of connections for connecting to a plurality of computer chassis, wherein the multi-tiered support defines passageways configured to deliver the coolant to each computer chassis connection;

a computer chassis configured to mount in the multi-tiered support, to connect to a connection of the plurality of connections, and to receive the coolant from the connection;

a first computer component and a second computer component within the computer chassis;

a first cold plate and a second cold plate in thermal communication with the first and second computer components, respectively, the cold plates being configured to conduct heat from the components, and further being configured to be convectively cooled by the coolant; and a control system configured to control the level of cooling provided to the first and second computer components;

wherein the cooling system is configured to deliver coolant to the first and second computer components in parallel; and wherein the control system is configured to control the relative rate of coolant flow to the first and second computer components.

27. The modular computer system of claim 26, and further comprising a heat exchanger external to the plurality of chassis and configured to cool the coolant.

* * * * *

UNITED STATES PATENT AND TRADEMARK OFFICE
CERTIFICATE OF CORRECTION

PATENT NO. : 7,203,063 B2
APPLICATION NO. : 10/849759
DATED : April 10, 2007
INVENTOR(S) : Cullen E. Bash et al.

Figure 10:
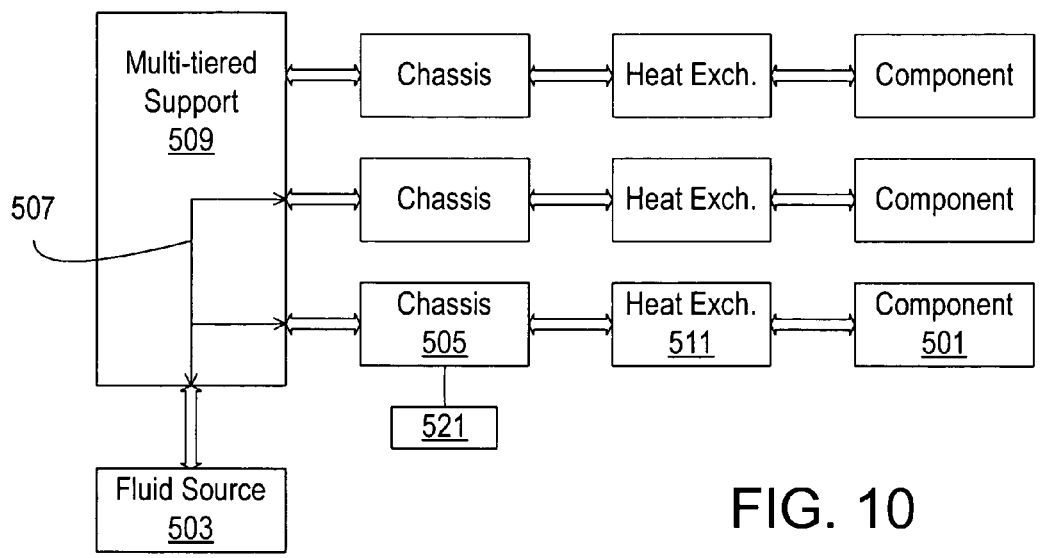
FIG. 10 is a block diagram of a second variation of the first embodiment, depicted in FIG. 1.

It is certified that error appears in the above-identified patent and that said Letters Patent is hereby corrected as shown below:

In column 9, line 3, below "cooling system as incorporated above by reference." insert -- With reference to FIG. 10, a second variation, which is applicable to the first or second embodiments, may be similar to the first or second embodiments in many features. This variation differs in that rather than (or supplemental to) drawing in ambient air to cool components 501, a source of chilled fluid 503 such as air or another gaseous fluid (or conceivably even a liquid fluid for an appropriate application) is in fluid communication with the chassis 505, preferably via passageways 507 within the rack 509. The chilled fluid preferably enters the upstream chamber of the first embodiment, or the air mover intake manifold of the second embodiment, so as to pass through the heat exchanger 511. Similar to as noted above, modular racks configured for embodiments of this variation might also receive typical air-cooled chassis, as well as receive similarly configured chassis (e.g., chassis configured to receive chilled air from a rack) that lack any type of liquid cooling, or that are configured with an evaporative cooling system as incorporated above by reference. --.

In column 14, line 28, in Claim 26, delete "comprising;" and insert -- comprising: --, therefor.

Signed and Sealed this

Twenty-eighth Day of July, 2009

JOHN DOLL
*Acting Director of the United States Patent and Trademark Office*